United States Patent
Ferm et al.

(10) Patent No.: US 11,751,372 B2
(45) Date of Patent: Sep. 5, 2023

(54) ELECTRICAL VERIFICATION OF ELECTRONIC COMPONENTS

(71) Applicant: Mycronic AB, Taby (SE)

(72) Inventors: Bobbi Ferm, Sollentuna (SE); Olle Betzen, Jarfalla (SE)

(73) Assignee: Mycronic AB, Taby (SE)

( * ) Notice: Subject to any disclaimer, the term of this patent is extended or adjusted under 35 U.S.C. 154(b) by 207 days.

(21) Appl. No.: 17/419,916

(22) PCT Filed: Jan. 20, 2020

(86) PCT No.: PCT/EP2020/051220
§ 371 (c)(1),
(2) Date: Jun. 30, 2021

(87) PCT Pub. No.: WO2020/152074
PCT Pub. Date: Jul. 30, 2020

(65) Prior Publication Data
US 2022/0087085 A1    Mar. 17, 2022

(30) Foreign Application Priority Data

Jan. 25, 2019 (EP) .................................... 19153748

(51) Int. Cl.
*H05K 13/08* (2006.01)
*H05K 13/04* (2006.01)
*G01R 27/02* (2006.01)

(52) U.S. Cl.
CPC .......... *H05K 13/082* (2018.08); *G01R 27/02* (2013.01); *H05K 13/0404* (2013.01)

(58) Field of Classification Search
CPC ........ G01R 27/00; G01R 27/02; H05K 13/00; H05K 13/04; H05K 13/0404; H05K 13/08; H05K 13/082
USPC .................................................. 324/600, 649
See application file for complete search history.

(56) References Cited

FOREIGN PATENT DOCUMENTS

| CN | 101454229 A | * | 6/2009 | ............. B65G 47/80 |
| CN | 102742378 A | | 10/2012 | |
| CN | 103477237 A | | 12/2013 | |
| EP | 0783241 A2 | * | 7/1997 | ......... H05K 13/0812 |
| EP | 2981164 A1 | | 2/2016 | |

(Continued)

OTHER PUBLICATIONS

International Search Report PCT/ISA/210 for International Application No. PCT/EP2020/051220 dated Jan. 20, 2020.

*Primary Examiner* — Hoai-An D. Nguyen
(74) *Attorney, Agent, or Firm* — Harness, Dickey & Pierce, P.L.C.

(57) ABSTRACT

The present invention provides a component mounting machine -comprising a picking tool for picking electronic components from a source of electronic components and placing them onto a workpiece, a verification unit for measuring an electrical property of an electronic component picked and held by the picking tool. The verification unit comprises a board, a plurality of test electrodes arranged on a surface of said board and a system for measuring an output signal from the test electrodes upon contact between a picked electronic component and at least two of said test electrodes. Further, at least one test electrode arranged on a flexible portion of the board that is configured to flex upon engagement between a picked electronic component and said at least two test electrodes.

15 Claims, 4 Drawing Sheets

(56) References Cited

FOREIGN PATENT DOCUMENTS

| EP | 3313163 A1 | 4/2018 | |
|---|---|---|---|
| JP | 2007299966 A * | 11/2007 | ............ H05K 13/04 |
| WO | WO-2013/113766 A1 | 8/2013 | |
| WO | WO-2013/186861 A1 | 12/2013 | |
| WO | WO-2020152074 A1 | 7/2020 | |

* cited by examiner

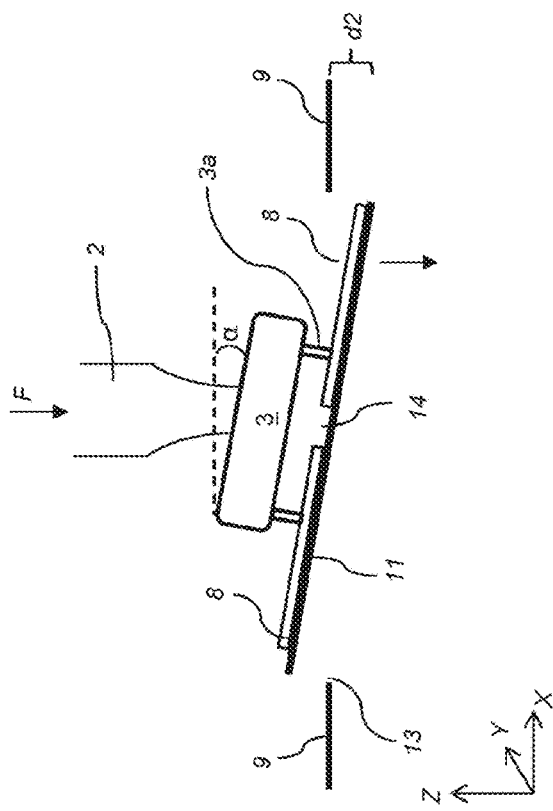
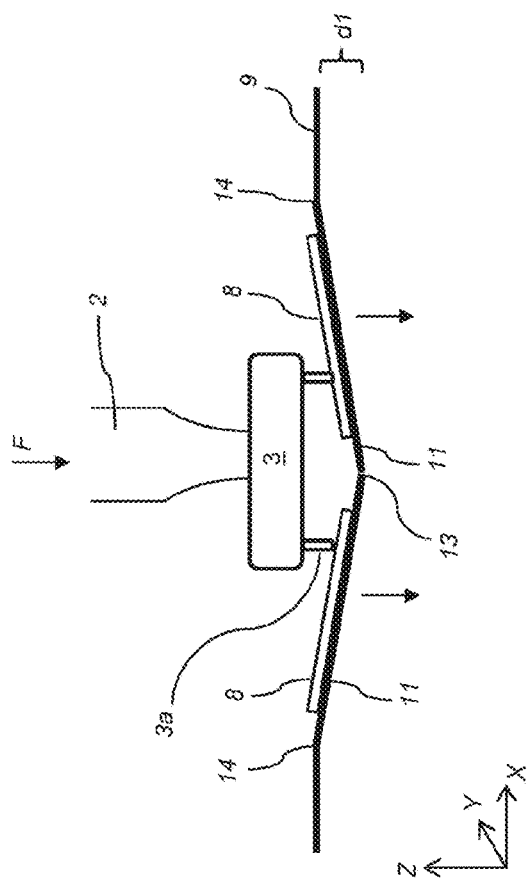
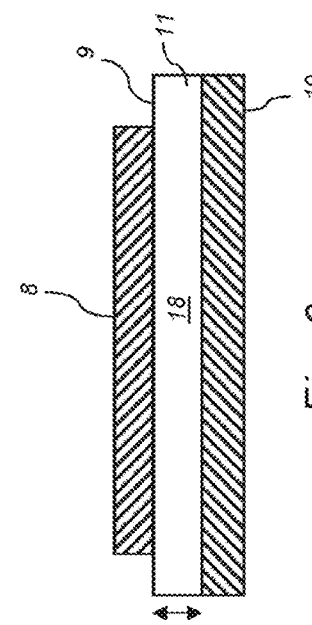
Fig. 4a
Fig. 4b
Fig. 5
Fig. 6

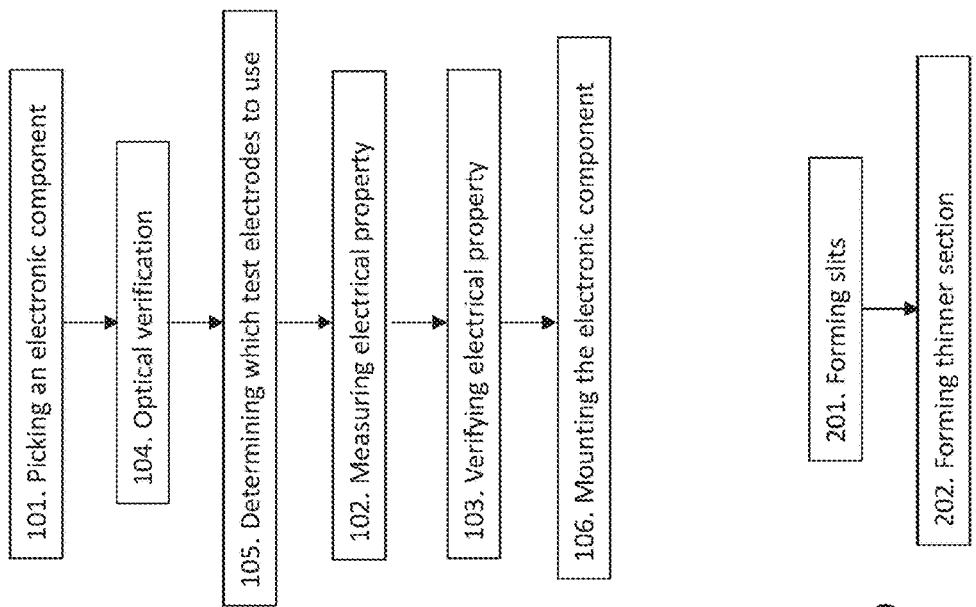
Fig. 8
Fig. 9
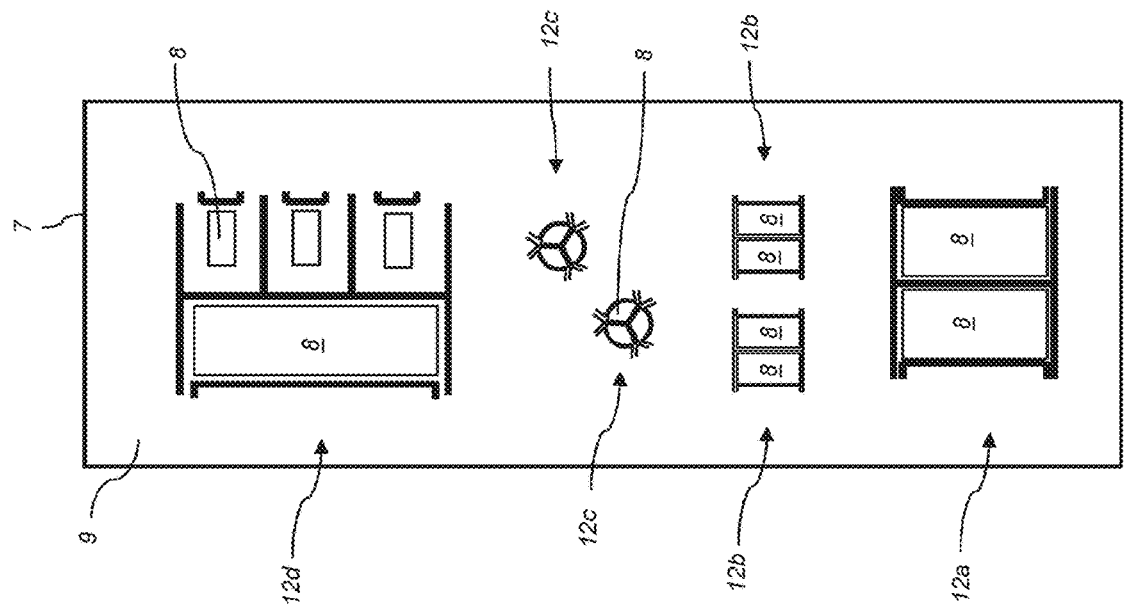
Fig. 7

ELECTRICAL VERIFICATION OF ELECTRONIC COMPONENTS

This application is a national phase under 35 U.S.C. § 371 of PCT International Application No. PCT/EP2020/051220 which has an International filing date of Jan. 20, 2020, which claims priority to EP Application No. 19153748.9, filed Jan. 25, 2019, the entire contents of each of which are hereby incorporated by reference.

TECHNICAL FIELD

The present inventive concept relates to the field of pick and place technology.

More particularly, it relates to electrical verification of electronic components used in pick and place technology.

BACKGROUND

Machines for pick-and-place mounting of components on a workpiece, such as a Printed Circuit Board (PCB), or a substrate for a System in Package (SiP), are subject to different, often contradictory demands, such as mounting speed, mounting precision, size, price, etc. The expression "pick and place" may be understood by the person skilled in the art as describing the very mounting operation where a mounting head is moved to a component feeder area, where the mounting head picks one or more components from one or more of the component feeders, and then is moved to a mounting area where the mounting head places the component or components on the workpiece.

Before mounting an electronic component on e.g. a printed circuit board, the electrical properties may be controlled and verified by the pick and place machine. This decreases the risk of mounting damaged components in electronic assemblies. For example, the pick and place machine may verify that a resistor has a value within a certain specification before mounting it on a Printed Circuit Board (PCB). Also verification of the correct type of electronic component and the correct type of component reel may be verified by the machine WO 2013/113766 discloses a method of discovering a risk for damaged components in electronic assemblies, especially caused by electro-static discharge events.

However, there is a need in the art for improved systems and methods for verifying the electrical properties of electronic components in the pick and place technology.

SUMMARY

It is an object of the invention to at least partly overcome one or more limitations of the prior art. In particular, it is an object to provide a component mounting machine, such as a pick and place machine, which facilitates a good contact between the electronic component to be tested and the test electrodes used for measuring the electrical properties.

As a first aspect of the invention, there is provided a component mounting machine comprising:
- a picking tool for picking electronic components from a source of electronic components and placing them onto a workpiece,
- a verification unit for measuring an electrical property of an electronic component picked and held by the picking tool; wherein
- the verification unit comprises a board, a plurality of test electrodes arranged on a surface of said board and a system for measuring an output signal from the test electrodes upon contact between a picked electronic component and at least two of said test electrodes;
- and wherein at least one test electrode is arranged on a flexible portion of the board that is configured to flex upon engagement between a picked electronic component and said at least two test electrodes.

The component mounting machine may be a pick and place (PnP) machine, such as a PnP machine for mounting electronic components on a Printed Circuit Board (PCB). The workpiece may thus be a PCB.

The picking tool may be configured to pick up an electronic component by activating e.g. a suction device, transport them to the workpiece after an optical and electrical verification, and thereafter place them at a precise location on the workpiece. The picking tool may thus be movable between a resting position and a placing and/or picking position. The placing and/or picking position may be a position where the picking tool may place a component on a surface, such as a surface of a PCB, or a position where the picking tool may pick a component from a source.

The source of electronic components may comprise reels in which the electronic components are stored. Electronic components include for example resistors, capacitors and transistors.

The verification unit is for measuring at least one electrical property of an electronic component that has been picked and is held by the picking tool. Based on the measurement, the verification unit may also verify that the electronic component has an electrical property within a defined specification.

The verification unit comprises a board onto which a plurality of test electrodes is arranged. The test electrodes may comprise any type of suitable metal for conducting current. The board may be of a polymeric material. The board may be of a material used for a Printed Circuit Board, i.e. it may comprise FR-4 (sometimes denoted FR4), which is a glass-reinforced epoxy laminate material. FR-4 is a composite material composed of woven fiberglass cloth with an epoxy resin binder.

The test electrodes are arranged on a surface of the board and the electronic components are tested by engaging the electronic component held by the picking tool with at least two electrodes. This is achieved by pressing the picked electronic component against the test electrodes using the picking tool. Once in contact, the system for measuring an output signal from the tested electrodes in contact with the electronic component may measure a specific electrical property, depending on the type of electronic component tested. The system may also verify that the electronic component is not damaged using the information from the measurement of the electrical property. As an example, the system may measure and verify that the resistance of a resistor is within an acceptable interval.

At least one, such as all, test electrodes are arranged on a flexible portion of the board. A flexible portion refers to a portion that flexes, or is compressed, upon an engagement force applied to the electronic component by the picking tool. The flexible portion may thus be a resilient portion. The flexible portion may have a flexibility that is higher than the flexibility of the material of the board, such as higher than the average flexibility of the board. Thus, the board material itself may have a certain flexibility, and the flexible portions may have a flexibility that is higher than the flexibility of the board material.

The first aspect of the invention is based on the insight that if at least one test electrode is arranged on a flexible portion, it increases the possibility of a good electrical contact between the electronic component and the electrode. This is because the flexible portion may absorb some mechanical errors and still make sufficient contact between the electrodes and the component to enable measuring. Thus, the first aspect of the invention increases the reliability of the verification unit of the component mounting machine, e.g. compared to mounting machines in which the test electrodes are arranged on a firm surface. This is advantageous in case the electronic component is not held completely in parallel to the surface of the electrodes. Using a firm surface, small alignment errors may cause some leads of the electronic component not to touch the test electrodes. Thus, the component mounting machine of the first aspect allows for a good electronic contact between test electrodes and electronic component even if there is an alignment error, i.e. if the electronic component is held by the picking tool with an angular error relative the test electrode surface.

In embodiments of the first aspect at least one flexible portion is defined by slits in the board and at least one hinge portion of the board, wherein the at least one hinge portion is configured to function as a pivot point for the flexible portion.

The flexible portions may thus be of the same material as the board.

The slits are deep enough to go through the whole thickness of the board and thus form gaps in the board. The slits may thus form a gap and be arranged so that the flexible portion onto which an electrode is arranged may flex into the gap upon a pressure applied by the picking tool.

The slits may be arranged on the surface around an electrode and may, together with the hinge portions, define the surface boundaries of a flexible portion of the board. The hinge portions are arranged on the surface of the board so that they function as pivot points as the flexible portion flexes or moves into the gap defined by the slits at the flex into the gap defined by the slits.

A flexible portion may comprise more than one hinge portion, such as at least two, hinge portions. Consequently, in embodiments at least one flexible portion is defined by slits in the board and at least two hinge portions of the board.

Further the hinge portion may be thinner than the average thickness of the board and flexible portions. Thus, at least one hinge portion may comprise a section that is thinner than the flexible portion.

As an example, the surface onto which the test electrodes are arranged may be a front surface of said board and said section that is thinner than the flexible portion may be formed by a cut-out on the reverse surface of the board.

The cut-out does not extend through the whole thickness of the electrode board.

The test electrodes arranged on the board may have any suitable form, such as a square or rectangular form. The test electrodes may be flat electrodes. Thus, in embodiments of the first aspect, at least one test electrode is four-sided. Further, the slits may surround at least three of the four sides.

As a further example, the test electrode, such as the test electrodes of a cluster of test electrodes, may together form a circular shape. Thus, in embodiments, at least one test electrode is shaped as a circle section, and the slits may surround the radial sides of the circle section.

In embodiments of the first aspect, the board comprises a plurality of flexible portions that are arranged to flex independently of each other.

As an example, the board may comprise at least 2 flexible portions that are arranged to flex independently of each other. In other variants, the board comprises at least 4, or at least 8, or at least 12 flexible portions that may or may not be arranged to flex independently of each other.

In embodiments of the first aspect, the plurality of test electrodes are arranged in clusters of at least two test electrodes in each cluster.

The electrodes may thus be arranged in clusters on the surface of the board. A cluster may comprise at least two electrodes. Different clusters may comprise different numbers of electrodes of different size and shape. Different clusters may thus be configured for measuring the electrical property of different electronic components. A cluster of electrodes may thus be adapted for measuring the electrical properties of a specific electronic component.

As an example, the test electrodes of at least one cluster may be arranged on individual flexible portions of the board.

Consequently, a flexible portion may comprise a single electrode and the electrodes of a cluster may be arranged on different, individual, flexible portions.

As an example, the test electrodes arranged on individual flexible portions may be dimensioned such that different pins of an electronic component may contact different test electrodes of the cluster.

The pin of an electronic component may be a lead of the electronic component.

For example, the board may comprise different types of clusters, and the different types of clusters may be arranged on the board to contact different types of electronic components.

Consequently, the board may comprise at least one cluster of test electrodes for contacting a resistor, at least one cluster of electrodes for contacting a diode and at least one cluster of electrodes for contacting a capacitor.

Furthermore, the test electrodes of all clusters may be arranged on individual flexible portions of the board.

The flexible portion of the board may also be formed by other means than slits in the board. The flexible portion may be a thinner section of the board arranged on supports that allows for flexing upon contact with the electronic component. The flexible portion may comprise a spring loaded pin, such as a "pogo pin". A test electrode may be arranged onto the pin or on the board under the pin. The pin may be configured to allow for electrical contact between an electronic component pressed against the pin and a test electrode or the system for measuring an output signal from the test electrodes arranged under the pin.

In embodiments of the first aspect, the flexible portion is formed by a resilient material arranged under the surface of the board at the position of at least one test electrode.

The resilient material may thus be compressed by the force applied by the picking tool when an electrode component contacts a test electrode. The board may thus be a multi-layered material comprising a base layer, a thin surface layer onto which the test electrodes are arranged and a resilient material arranged between the base layer and the thin surface layer.

As an example, the resilient material may be arranged under the positions of all test electrodes.

In embodiments of the first aspect, the flexible portion of the board is configured to flex at least 0.01 mm, such as between 0.01-0.5 mm, such as 0.1-0.5 mm, upon engagement with a picked electronic component with an engagement force of 0.1-10 N, such as 0.1-5 N.

In embodiments of the first aspect, the flexible portion of the board is configured to flex at least 0.1 mm upon engagement with a picked electronic component with an engagement force of 1-1.5 N.

In embodiments of the first aspect, the flexible portion of the board is configured to flex at least 0.1 mm, such as 0.1-0.5 mm, upon engagement with a picked electronic component with an engagement force of 1.0 N.

In embodiments of the first aspect, the flexible portion of the board is configured to flex at least 0.1 mm, such as 0.1-0.5 mm, upon engagement with a picked electronic component with an engagement force of 1.5 N.

In embodiments of the first aspect, the flexible portion of the board is configured to flex 0.1-0.5 mm upon engagement with a picked electronic component with an engagement force of 1-1.5 N.

An engagement force of 1-1.5 N is the force usually applied to the electronic components in a pick and place machine and is a pressure that the electronic components can withstand. The inventors have found that a flex or compression of at least 0.1 mm, such as 0.1-0.3 mm at an engagement force of 1-1.5 N increases the reliability of the verification unit.

According to a second aspect of the present inventive concept, there is provided a method for measuring an electric property of an electronic component comprising the steps of:
- a) picking an electronic component by a picking tool in a component mounting machine according to the first aspect above,
- b) measuring at least one electrical property of the electronic component picked and held by the picking tool using the verification unit of the component mounting machine.

This aspect may generally present the same or corresponding advantages as the former aspect. The workpiece may be a PCB.

In embodiments of the second aspect, the method is further comprising a step of verifying that the electronic component is functioning or deciding that the electronic component is not functioning based on the measurement of step b).

The verification may be performed by the system for measuring an output signal from the test electrodes upon contact between a picked electronic component and at least two of the electrodes. The outcome may be a determination that the component is "functioning" or "not functioning". In other variants, the result of the verification may be a determination or indication that the measured electrical property of the component is within an acceptable tolerance range (which may be referred to as being within the specification), or that it is outside the acceptable tolerance range (which may be denoted as being outside the specification).

In embodiments of the second aspect, the method is further comprising a step of optical verification of the electronic component picked and held by the picking tool.

This step may be performed before or after step b), i.e. before or after measuring at least one electrical property and verifying an electrical property of the electronic component. The step of optical verification may comprise verifying the type of electronic component, e.g. by scanning a code or another type of identity tag on the electronic component. The optical verification may comprise verifying that the electronic component has the correct dimensions and/or how the electronic component is held by the picking tool. This may facilitate moving the picking tool to a position in the component mounting machine that allows the electronic component to be mounted at the correct position on the workpiece and in correct alignment with other components on the workpiece, even if the electronic component has been picked up with a slight offset angle by the picking tool. The step of optical verification may be performed by a visual device, such as a camera.

In embodiments of the second aspect, the method is further comprising a step of determining which test electrodes on the board to contact with the electronic component based on the information from the step of optical verification.

In embodiments of the second aspect, the method is further comprising a step of mounting the electronic component that has been verified as functioning on a workpiece.

According to a third aspect of the present inventive concept, there is provided a board for testing the electrical properties of an electronic component; said board comprising
- a plurality of test electrodes arranged on a first surface of said board, wherein at least one test electrode is arranged on a flexible portion of the board that is configured to flex upon engagement with an electronic component to be tested.

This aspect may generally present the same or corresponding advantages as the former aspect. The board may thus be for use in a component mounting machine, such as a pick and place machine.

The board, the test electrodes and the flexible portion or portions may be a discussed herein above in relation to the component mounting machine. Thus, the board may be as defined in any embodiment or example of the first aspect of the invention above.

According to a fourth aspect of the present inventive concept, there is provided a method of manufacturing a board according to the third aspect above, in which at least one flexible portion is defined by slits in the board and at least one hinge portion of the board; comprising the steps of
- a1) forming slits in said board around at least one side of a test electrode,
  thereby forming said flexible portion and at least one hinge portion.

The slits may be formed so that they extend through the whole thickness of the board, i.e. so that they form gaps in the board.

The test electrodes may comprise electrodes that are four-sided and step b1) may comprise forming slits around at least three of the four sides.

In embodiments of the fourth aspect, the method is further comprising a step of forming a section of a hinge portion that is thinner than the flexible portion, wherein the surface onto which the test electrodes are arranged is a front surface of said board and said section that is thinner than the flexible portion is formed as a cut-out on the reverse surface of the board.

The cut-out may be formed before or after step a1). The cut-out does not extend through the whole thickness of the board.

In embodiments of the fourth aspect, step a1) is performed by laser cutting or cutting with a water jet.

It may be advantageous to use laser cutting for forming the slits since this may be performed with high accuracy and with little damage of the board.

The laser cutting may be performed by a UV-laser, such as a UV laser having an emission wavelength peak between 10-400 nm.

In embodiments of the fourth aspect in which laser cutting is used in step b1), the method is further comprising a step of removing carbon residues formed in the board during the laser cutting. Such carbon residues may otherwise conduct current and may interfere with the measuring of the electrical properties.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

FIG. 4a illustrates using the electrodes in FIG. 2 for testing an electrical property of an electronic component.

FIG. 4b illustrates using the electrodes in FIG. 3a for testing an electrical property of an electronic component.

FIG. 5 shows a side view of an embodiment of a flexible portion.

FIG. 6 shows an embodiment is which the flexible portion is formed by a resilient layer.

FIG. 7 shows an example of a board that comprises four types of clusters of test electrodes.

FIG. 8 illustrates the steps in a method for measuring an electrical property.

FIG. 9 illustrates the steps in a method for manufacturing a board according to the present disclosure.

DETAILED DESCRIPTION

Figure 1:
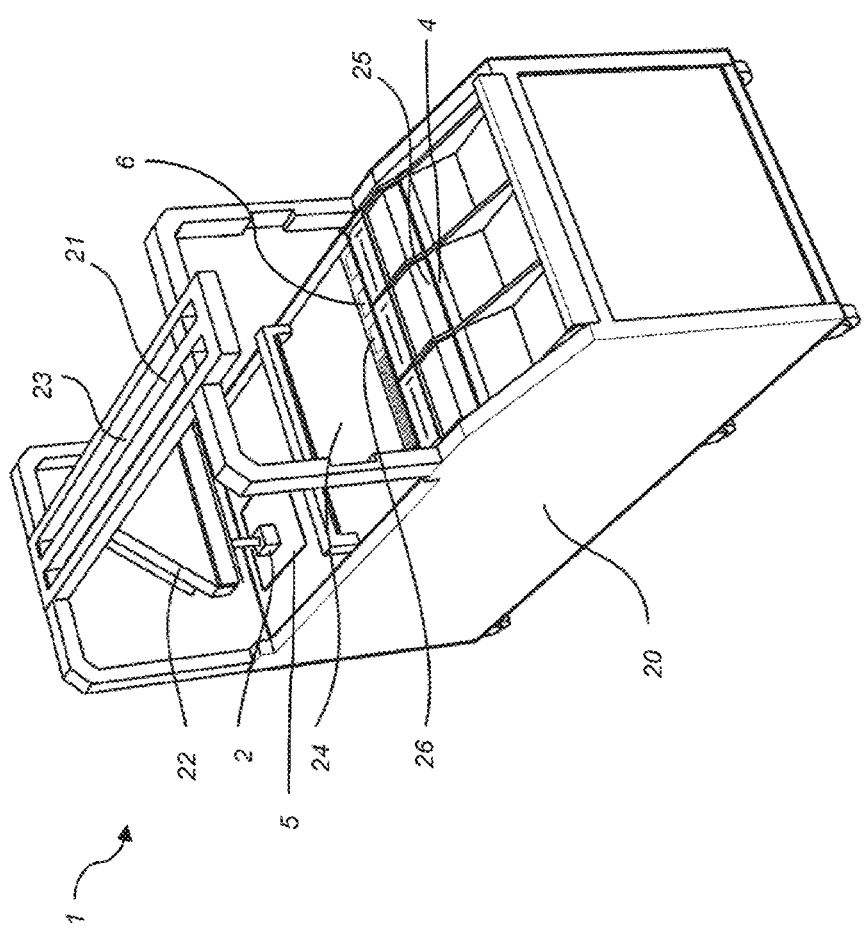
FIG. 1 is an illustration of a component mounting machine 1 of the present disclosure.

A schematic example of a component mounting machine 1 is shown in FIG. 1 of the attached drawings. The component mounting machine 1 comprises a machine frame 20, a source 4 of electronic components, which includes a component feeding device 25 having a plurality of component feeders, arranged at a component feeder area of the machine frame 20. The machine 1 further comprises a gantry system 21 having a first beam, or X beam 22, and a second perpendicular beam, or Y beam 23, attached to the machine frame 20, a picking tool 2 movably attached to the X beam 22, and a board transportation system 24, attached to the machine frame 20. The electronic components are presented to the picking tool 2 from the source 4 by the component feeding device 25. The board transportation system 24 transports workpieces 5, such as PCBs, between a conveyor line and a working area of the component mounting machine 1. The gantry system 21 makes it possible to move the picking tool 2 between the component feeding device 25 and the workpiece 5. Further, the picking tool 2 is arranged in a component mounting arrangement that is movable in the vertical direction, and is also able to rotate around a vertical axis. It also contains a suction device. This makes it possible to pick up, by activating the suction device, electronic components from the component feeding device 25, transport them to the workpiece 5, and place them at a precise location on a surface of the workpiece 4. During the transport from pick up to the substrate a vision centering device 26 is passed to get an accurate position of picked components.

The machine 1 further comprises a verification unit 6 for measuring an electrical property of an electronic component that is picked and held by the picking device 4 before it is mounted onto the workpiece 5.

Figure 2:
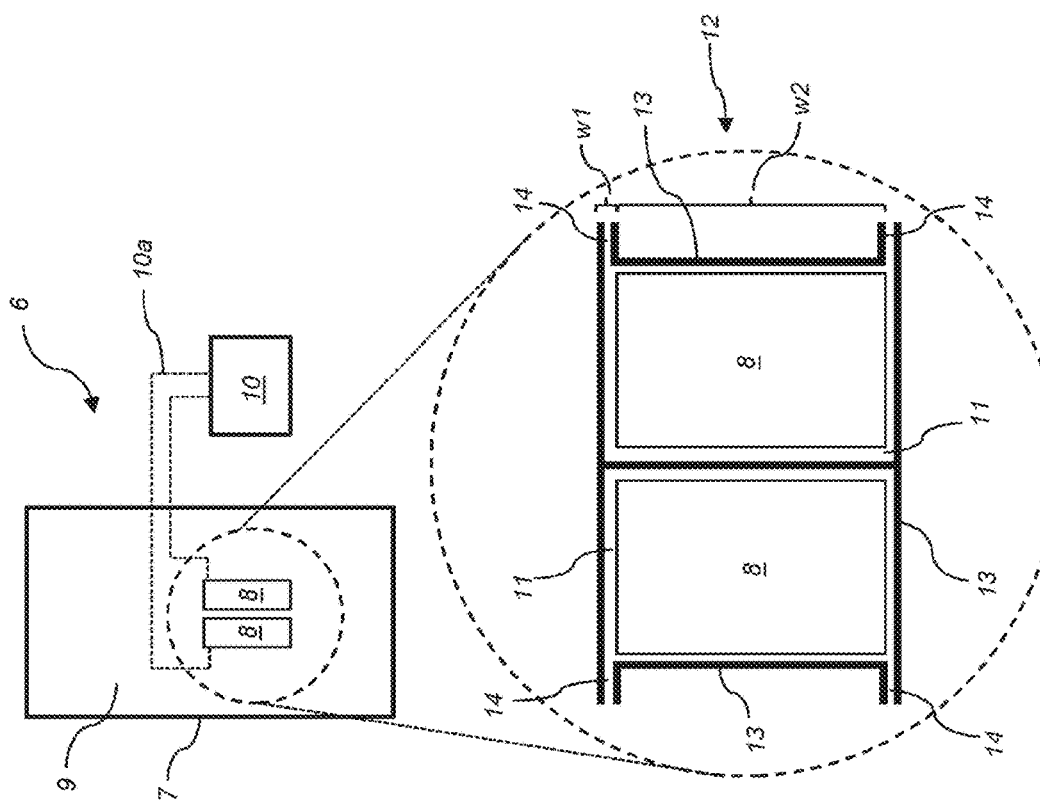
FIG. 2 is an illustration of a verification unit of the present disclosure.

The verification unit 6 is further schematically illustrated in FIG. 2, and comprises a board 7 onto which a number of test electrodes 8 are arranged on a front surface 9 of the board 7. In FIG. 2, only two test electrodes 8 are shown for clarity reasons. The board 7 may comprise more than ten, such as more than twenty, test electrodes. There is further a system 10 for measuring an output signal from the test electrodes. The system 10 may be connected to the test electrodes 8 by signal measuring means 10a, which may be arranged to contact the test electrodes 8 from the reverse side 16 of the board 7.

The test electrodes 8 are in arranged in a cluster 12 on the surface 9. The cluster 12 of two test electrodes 12 is for measuring the electrical properties of a type of electronic component when the electronic component is contacts both electrodes 8. The test electrodes 8 are arranged on individually flexible portions 13. The flexible portions 11 are defined by slits 13 in the board 7 and hinge portions 14 of the board 7. The hinge portions 14 are configured to function as a pivot point for the flexible portion 11. This is further illustrated in FIGS. 4a and 4b. In this embodiment, the test electrodes 8 have a rectangular shape, and the slits 13 extend in the board 7 completely around three sides of the four-sided electrodes 8. The slits 13 are deep enough to form gaps, i.e. they extend all the way through the thickness of the board, so that the flexible portions may flex down into the gap formed by the slits 14 by pivoting around the hinge portions 14. In the example shown in FIG. 2, there are two hinge portions 14 for each flexible portion 11. The test electrode 8 has four sides, and both hinge portions 11 of a flexible portion 11 are arranged on the same side of four-sided test electrode 8. Thus, the two hinge portions 14 of a flexible portion 11 are arranged to function as pivot points for a single flexible portion 11. The board 7 of FIG. 2 thus comprises two flexible portions 11 that are arranged to flex independently of each other. Thus, the test electrodes 8) of the cluster 12 are arranged on individual flexible portions 11 of the board 7.

The hinge portions 14 have a width w1 that is less than half of the side w2 of the test electrode 8, such as less than 20 percent of a side w2 of a test electrode 8. Further, the signalling measuring means 10a, such as wires or leads, are arranged at the position of the hinge regions, thereby enabling contact with the test electrodes 8.

Figure 3A:
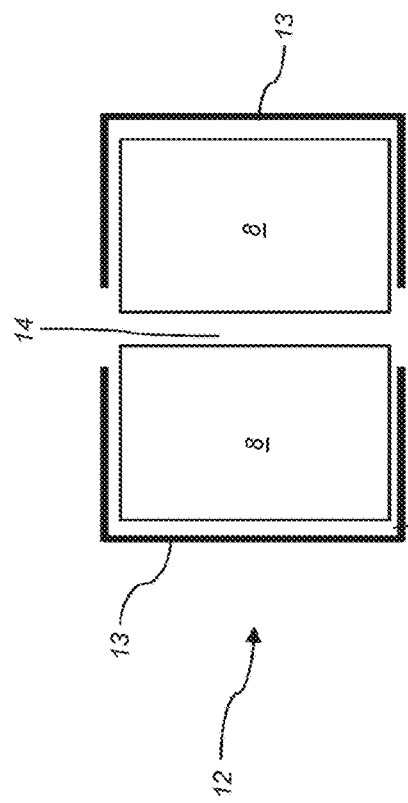
FIGS. 3a and 3b are illustrations of two clusters of test electrodes.

FIG. 3a shows an alternative embodiment of how a cluster 12 of two test electrodes 8 may be arranged. In this example, both test electrodes 8 are arranged on the same flexible portion 11 and there is a single hinge portion 14 arranged between the test electrodes 8. The slits 13 are formed around the three sides of the rectangular test electrodes 8 that do not face the other test electrode, whereas the hinge portion 14 between the electrodes functions as a common pivot point for the flexible portion 11 onto which both electrodes 8 are arranged.

Figure 3B:
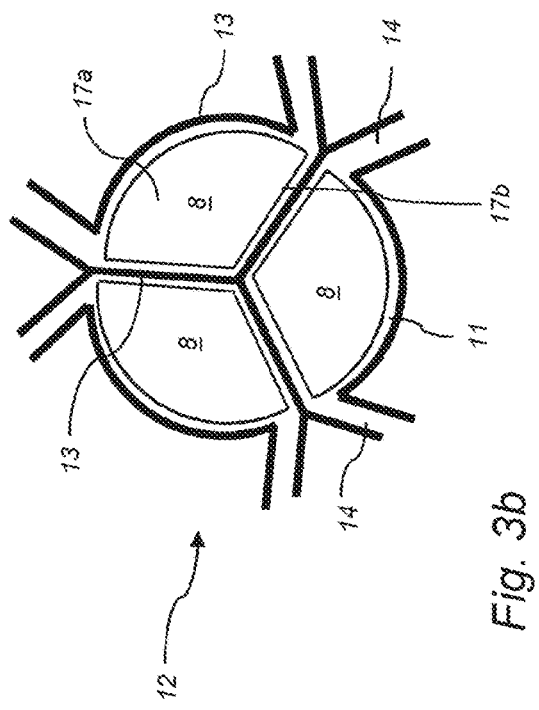

As seen in FIG. 3b a cluster 12 may comprise more than two test electrodes 8. The number of test electrodes in a cluster may depend on the type of electronic component that is to be tested by the cluster of electrodes. In the embodiment shown in FIG. 3b, the cluster 12 comprises test electrodes 8 shaped a sections of a circle, so that the cluster itself has a circular form. A circular section 17a is arranged on a flexible portion 11 that is formed by slits 13 that surrounds the radial sides 17b of the circular section 17a. Each flexible portion comprising the electrode 8 shaped as a circle section 17b has two hinge portions, so that the flexible portions may flex downwards independently from each other.

FIG. 4a illustrates testing an electronic component 3 using the two electrodes 8 of the example discussed in relation to FIG. 2 above. FIG. 4a is thus a side view of a portion of the board 7. The board extends in the XY plane, and the two test electrodes 8 also extend with their largest, flat sides in the XY plane. An electronic component 3, held by the picking tool 2, is during testing forced against the test electrodes in the negative Z direction, as illustrated by the arrow in FIG. 4a. The electronic component has two pins 3a, and the two test electrodes 8 are arranged on the upper surface 9 of the board 7 so that on pin may engage one test electrode 8 and the other pin may simultaneously engage the other test electrode 8. Upon engagement with the test electrodes 8, the two flexible portions 11 flex in the negative Z direction into the gap formed by slits 13 with pivot points at the hinge regions 14. The sizes of the hinge regions are dimensioned so that a desired stiffness of the hinge region is achieved. In the example of FIG. 4a, the hinge regions 14, are dimensioned taking into the account of the material of the flexible portion and the hinge region, so that the flexible portion flexes downwards in the Z-direction a maximum distance of about 0.2 mm or less at a downward pressure of about 1.5 N.

Thus, distance d1 may be about 0.2 mm when the electrodes 8 are engaged by an electronic component 3 with an engagement pressure of 1.5 N. Upon contact with the pins 3a with the electrodes 8, the system 10 may measure an output signal from the test electrodes 8 and verify that an electrical property is within a desired range.

FIG. 4b illustrates testing an electronic component 3 using the two electrodes 8 of the example discussed in relation to FIG. 3b above. FIG. 4b is thus a side view of a portion of the board 7. The board extends in the XY plane, and the two test electrodes 8 also extend with their largest, flat sides in the XY plane. An electronic component 3, held by the picking tool 2, is during testing forced against the test electrodes in the negative Z direction, as illustrated by the arrow in FIG. 4a. The two test electrodes 8 are arranged on the same flexible portion 11, and upon engagement with the test electrodes 8, the two flexible portions 11 flex in the negative Z direction into the gap formed by slits 13 with pivot points at the single hinge region 14 arranged between the electrodes. Similar to what is discussed in relation to the example of FIG. 4a above, the size of the hinge region 14 is dimensioned so that, distance d2 is about 0.2 mm or less when the electrodes 8 are engaged by an electronic component 3 with an engagement pressure of 1.5 N. Upon contact with the pins 3a with the electrodes 8, the system 10 may measure an output signal from the test electrodes 8 and verify that an electrical property is within a desired range.

The design of the board 7 with the flexible portions 11 as illustrated in FIGS. 4a and 4b makes it possible for the verification unit to test and verify the electronic components 3 even if they are held with a slight angle against the test electrodes and the surface of the board 7. This is for example illustrated in FIG. 4b, in which the electronic component is held by the picking tool 2 at an angle α against the test electrodes, i.e. the pins 3a are held with an angle α against the board 7. Using a board in which testing electrodes are arranged on a surface without any flexibility, an electronic component engaged with a slight angle against the electrodes would lead to poor contact between electrodes and the electronic component, and the electronic component would wrongfully be regarded as not functioning. Thus, using the board of the present disclosure, in which the electrodes are arranged on flexible portions, decreases the risk of false negative test results in the manufacturing process.

FIG. 5 shows a side view of an embodiment of a flexible portion 11, onto which electrode 8 is arranged. In this embodiment, the hinge portion 14 comprises a section 15 that is thinner than the rest of the flexible portion flexible portion 11. The thickness of the section 15 may thus be adjusted or selected when manufacturing the board 7 with the flexible portion 11 so that the flexible portion has a desired flexibility. The thickness of the section 15 may be selected such that the flexible portion 11 is configured to flex at least 0.1 mm upon engagement with a picked electronic component with an engagement force of 1-1.5 N. As seen in FIG. 5, the surface 9 onto which the test electrodes 8 are arranged form a front, or upper, surface of the board 7 and the section 15 that is thinner than the flexible portion 11 is formed by a cut-out 15a on the reverse surface, or backside surface 6, of the board 7.

FIG. 6 shows an embodiment is which the flexible portion 11 is formed by a resilient layer 18. The resilient layer 18 is formed under the upper surface 9 of the board under the position of a test electrode 8. The board is in this case a multi-layered material comprising a base layer 19, a thin surface layer 9 onto which the test electrodes 8 are arranged and a resilient material 18 arranged between the base layer 19 and the thin surface layer 9. The resilient layer 18 may extend under the positions of all test electrodes of a board. The resilient layer 18 may be a layer that can be compressed and then regain its original thickness. The resilient layer 18 may be a foam, such as foam rubber or a conductive foam.

A board 7 of a component mounting machine 1 may comprise different clusters with different numbers of test electrodes and clusters with test electrodes having different sizes and/or geometries. The different types of clusters 12 may be arranged on the board 7 to be suitable for contacting different types of electronic components 3. FIG. 7 shows an example of a board 7 that comprises four types of clusters 12a-d of test electrodes 12, all arranged on the same surface 9 of the board. Cluster 12a comprises two test electrodes arranged on individual flexible portions and is the cluster discussed in FIG. 2 above. This cluster of two rectangular test electrodes may be for testing and verifying resistors, such as resistors of large size that are used on PCBs. The two clusters 12b are similar in design as cluster 12a, but the two electrodes 8 in each cluster of type 12b are smaller in size than the electrodes 8 of cluster 12a. Clusters 12b may be for testing and verifying small resistors and capacitors used on PCBs.

The two clusters of type 12c are of a type discussed in relation to FIG. 3b above and thus comprise three test electrodes each, all on individual flexible portions and shaped as circle sections. A cluster of type 12c may be used for testing small electronic components having three pins.

The cluster of type 12d comprises an electrode 8 of a first rectangular size and also three electrodes of a second rectangular size that is smaller than the first rectangular size. All testing electrodes 8 in cluster 12d are arranged on individual flexible portions. During testing and verifying an electronic component using cluster 12d, only two out of the four electrodes may be used, such as the electrode of the first size and one of the electrodes of the second size. This may depend on how the electronic component is held by the picking toll during testing. The cluster of type 12d may be suitable for testing and verifying the electrical properties of transistors or diodes.

The different electrode clusters 12a-d arranged on the board 7 in FIG. 7 are thus arranged on individual flexible portions 11, which are dimensioned such that different pins 3a of an electronic component 3 may contact different test electrodes 8 of the cluster 12.

FIG. 8 schematically illustrates the steps in a method according to the present disclosure for measuring an electric property of an electronic component. The method comprises a first step of picking 101 an electronic component 3 by a picking tool 2 in a component mounting machine 1 as disclosed herein above. The method further comprises a step of optical verification 104 of the electronic component 3 picked and held by the picking tool 2. This may verify the type of electronic component that has been picked. Based on the optical verification 104, the method may comprise a step of determining 105 which test electrodes 8 on the board 7 to contact with the electronic component. The method then comprises measuring 102 at least one electrical property of the electronic component 3 picked and held by the picking tool 2 using the verification unit 6 of the component mounting machine 1. Based on the measurement of the electrical property, the method further comprises a step 103 of verifying that the electronic component 3 is functioning or determining that the electronic component 3 is not functioning. As a last step, the method may comprise a step of mounting 106 the electronic component 3 that has been verified as functioning on a workpiece 5, such as on a PCB. It is to be understood that the step 10 of optical verification may be performed before or after the step 102 of measuring at least one electrical property of the electronic component 3.

FIG. 9 schematically illustrates the steps in a method according to the present disclosure for manufacturing a board in which at least one flexible portion is defined by slits 13 in the board 7 and at least one hinge portion 4. The method comprises forming 201 slits 13 in the board 7 around at least one side of a test electrode 8, thereby forming said flexible portion 11 and at least one hinge portion 14. The method further comprises a step of forming 202 a section 15 of a hinge portion 14 that is thinner than the flexible portion 11, wherein the surface 9 onto which the test electrodes 8 are arranged is a front surface of said board 7 and said section 15 that is thinner than the flexible portion 11 is formed as a cut-out 15a on the reverse surface 16 of the board 7. Step 202 may be performed before or after step 201. Steps 201 and/or 202 may be performed by laser cutting, such as cutting with a UV laser, or cutting with a water jet.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The following is a non-limiting and itemized listing of embodiments of the present disclosure, presented for the purpose of describing various features and combinations provided by the invention in certain of its aspects.

Itemized Listing of Embodiments

1. A component mounting machine (1) comprising:
 a picking tool (2) for picking electronic components (3) from a source (4) of electronic components and placing them onto a workpiece (5),
 a verification unit (6) for measuring an electrical property of an electronic component (3) picked and held by the picking tool (2); wherein
 the verification unit (6) comprises a board (7), a plurality of test electrodes (8) arranged on a surface (9) of said board (7) and a system (10) for measuring an output signal from the test electrodes (8) upon contact between a picked electronic component (3) and at least two of said test electrodes (8);
 and wherein at least one test electrode (8) is arranged on a flexible portion (11) of the board (7) that is configured to flex upon engagement between a picked electronic component (3) and said at least two test electrodes (8).

2. A component mounting machine (1) according to item 1, wherein at least one flexible portion (11) is defined by slits (13) in the board (7) and at least one hinge portion (14) of the board (7), wherein the at least one hinge portion (14) is configured to function as a pivot point for the flexible portion (11).

3. A component mounting machine (1) according to item 2, wherein at least one flexible portion (11) is defined by slits (13) in the board (7) and at least two hinge portions (14) of the board (7).

4. A component mounting machine (1) according to item 2 or 3, wherein at least one hinge portion (14) comprises a section (15) that is thinner than the flexible portion (11).

5. A component mounting machine (1) according to item 4, wherein the surface (9) onto which the test electrodes (8) are arranged is a front surface of said board (7) and said section (15) that is thinner than the flexible portion (11) is formed by a cut-out (15a) on the reverse surface (16) of the board (7).

6. A component mounting machine (1) according to any one of items 2-5, wherein at least one test electrode (8) is four-sided and wherein the slits (13) surround at least three of the four sides.

7. A component mounting machine (1) according to any one of items 2-6, wherein at least one test electrode (8) is shaped as a circle section (17a), and wherein the slits (13) surrounds the radial sides (17b) of the circle section (17a).

8. A component mounting machine (1) according to any previous item, wherein the board (7) comprises a plurality of flexible portions (11) that are arranged to flex independently of each other.

9. A component mounting machine (1) according to any previous item, wherein the plurality of test electrodes (8) are arranged in clusters (12) of at least two test electrodes (8) in each cluster (12).

10. A component mounting machine (1) according to item 9, wherein the test electrodes (8) of at least one cluster (12) are arranged on individual flexible portions (11) of the board (7).

11. A component mounting machine (1) according to item 10, wherein the test electrodes (8) arranged on individual flexible portions (11) are dimensioned such that different pins (3a) of an electronic component (3) may contact different test electrodes (8) of the cluster (12).

12. A component mounting machine (1) according to any one of items 9-11 wherein the board (7) comprises different types of clusters (12), and wherein the different types of clusters (12) are arranged on the board (7) to contact different types of electronic components (3).

13. A component mounting machine (1) according to item 12, wherein the board (1) comprises at least one cluster (12) of test electrodes (8) for contacting a resistor, at least one cluster of electrodes for contacting a diode and at least one cluster of electrodes for contacting a capacitor.

14. A component mounting machine (1) according to any one of items 12-14, wherein the test electrodes (8) of all clusters (12) are arranged on individual flexible portions (11) of the board (7).

15. A component mounting machine (1) according to item 1, wherein the flexible portion (11) is formed by a resilient material (18) arranged under the surface (9) of the board (7) at the position of at least one test electrode (8).

16. A component mounting machine (1) according to item 15, wherein the resilient material (18) is arranged under the positions of all test electrodes (8).

17. A component mounting machine (1) according to any previous item, wherein said flexible portion (11) of the board (7) is configured to flex at least 0.1 mm upon engagement with a picked electronic component (3) with an engagement force of 1-1.5 N.

18. A method for measuring an electric property of an electronic component comprising the steps of:
   a) picking (101) an electronic component (3) by a picking tool in a component mounting machine (1) according to any one of items 1-17,
   b) measuring (102) at least one electrical property of the electronic component (3) picked and held by the picking tool (2) using the verification unit (6) of the component mounting machine (1).

19. A method according to item 18, further comprising a step of verifying (103) that the electronic component is functioning or deciding that the electronic component is not functioning based on the measurement of step b).

20. A method for according to item 18 or 19, further comprising a step of optical verification (104) of the electronic component (3) picked and held by the picking tool (2).

21. A method according to item 20, further comprising a step of determining (105) which test electrodes (8) on the board (7) to contact with the electronic component based on the information from the step of optical verification (104).

22. A method according to any one of items 18-21, further comprising a step of mounting (106) the electronic component (3) that has been verified as functioning on a workpiece (5).

23. A board (7) for testing the electrical properties of an electronic component (3); said board comprising
   a plurality of test electrodes (8) arranged on a first surface (9) of said board (7), wherein at least one test electrode (8) is arranged on a flexible portion (11) of the board (7) that is configured to flex upon engagement with an electronic component (3) to be tested.

24. A board (7) according to item 23, wherein at least one flexible portion (11) is defined by slits (13) in the board (7) and at least one hinge portion (14) of the board (7), wherein the at least one hinge portion (14) is configured to function as a pivot point for the flexible portion (11).

25. A board (7) according to according to item 24, wherein at least one flexible portion (11) is defined by slits (13) in the board (7) and at least two hinge portions (14) of the board (7).

26. A board (7) according to according to item 24 or 25, wherein at least one hinge portion (14) comprises a section (15) that is thinner than the flexible portion (11).

27. A board (7) according to according to item 26, wherein the surface (9) onto which the test electrodes (8) are arranged is a front surface of said board (7) and said section (15) that is thinner than the flexible portion (11) is formed by a cut-out (15a) on the reverse surface (16) of the board (7).

28. A board (7) according to according to any one of items 24-27, wherein at least one test electrode (8) is four-sided and wherein the slits (13) surround at least three of the four sides.

29. A board (7) according to according to any one of items 24-28, wherein at least one test electrode (8) is shaped as a circle section (17a), and wherein the slits (13) surrounds the radial sides (17b) of the circle section (17a).

30. A board (7) according to according to any one of items 23-29, wherein the board (7) comprises a plurality of flexible portions (11) that are arranged to flex independently of each other.

31. A board (7) according to according to any one of items 23-29, wherein the plurality of test electrodes (8) are arranged in clusters (12) of at least two test electrodes (8) in each cluster (12).

32. A board (7) according to item 31, wherein the test electrodes (8) of at least one cluster (12) are arranged on individual flexible portions (11) of the board (7).

33. A board (7) according to item 32, wherein the test electrodes (8) arranged on individual flexible portions (11) are dimensioned such that different pins (3a) of an electronic component (3) may contact different test electrodes (8) of the cluster (12).

34. A board (7) according to any one of items 31-33, wherein the board (7) comprises different types of clusters (12), and wherein the different types of clusters (12) are arranged on the board (7) to contact different types of electronic components (3).

35. A board (7) according to item 34, wherein the board (1) comprises at least one cluster (12) of test electrodes (8) for contacting a resistor, at least one cluster of electrodes for contacting a diode and at least one cluster of electrodes for contacting a capacitor.

36. A board (7) according to any one of item 31-36, wherein the test electrodes (8) of all clusters (12) are arranged on individual flexible portions (11) of the board (7).

37. A board (7) according to item 23, wherein the flexible portion (11) is formed by a resilient material (18) arranged under the surface (9) of the board (7) at the position of at least one test electrode (8).

38. A board (7) according to item 37, wherein the resilient material (18) is arranged under the positions of all test electrodes (8).

39. A board (7) according to any one of items 23-38, wherein said flexible portion (11) of the board (7) is configured to flex at least 0.1 mm upon engagement with a picked electronic component (3) with an engagement force of 1-1.5 N.

40. A method for manufacturing a board (7) according to item any one of items 23-39, in which at least one flexible portion (11) is defined by slits (13) in the board (7) and at least one hinge portion (14) of the board (7); comprising the step of
   a1) forming (201) slits (13) in said board (7) around at least one side of a test electrode (8), thereby forming said flexible portion (11) and at least one hinge portion (14).

41. A method according to item 40, further comprising a step of forming (202) a section (15) of a hinge portion (14) that is thinner than the flexible portion (11), wherein the surface (9) onto which the test electrodes (8) are arranged is a front surface of said board (7) and said section (15) that is thinner than the flexible portion (11) is formed as a cut-out (15a) on the reverse surface (16) of the board (7).

42. A method according to item 40 or 41, wherein step a1) is performed by laser cutting or cutting with a water jet.

The invention claimed is:
1. A component mounting machine comprising:
   a picking tool for picking electronic components from a source of electronic components and placing them onto a workpiece,
   a verification unit for measuring an electrical property of an electronic component picked and held by the picking tool; wherein the verification unit comprises a board, a plurality of test electrodes arranged on a surface of said board and a system for measuring an output signal from the test electrodes upon contact between a picked electronic component and at least two of said test electrodes;

and wherein at least one test electrode is arranged on a flexible portion of the board that is configured to flex upon engagement between a picked electronic component and said at least two test electrodes.

2. A component mounting machine according to claim 1, wherein at least one flexible portion is defined by slits in the board and at least one hinge portion of the board wherein the at least one hinge portion is configured to function as a pivot point for the flexible portion.

3. A component mounting machine according to claim 2, wherein at least one hinge portion comprises a section that is thinner than the flexible portion.

4. A component mounting machine according to any one of claims 2, wherein at least one test electrode is four-sided and wherein the slits surround at least three of the four sides.

5. A component mounting machine according to claim 1, wherein the board comprises a plurality of flexible portions that are arranged to flex independently of each other.

6. A component mounting machine according to claim 1, wherein the plurality of test electrodes are arranged in clusters of at least two test electrodes in each cluster.

7. component mounting machine according to claim 5, wherein the test electrodes arranged on individual flexible portions are dimensioned such that different pins of an electronic component may contact different test electrodes of the cluster.

8. A component mounting machine according to claim 5 wherein the board comprises different types of clusters, and wherein the different types of clusters are arranged on the board to contact different types of electronic component.

9. A component mounting machine according to claim 1, wherein the flexible portion is formed by a resilient material arranged under the surface of the board at the position of at least one test electrode.

10. A component mounting machine-4$ according to claim 1, wherein said flexible portion of the board is configured to flex at least 0.1 mm upon engagement with a picked electronic component with an engagement force of 1-1.5 N.

11. A method for measuring an electric property of an electronic component comprising the steps of:
  a) picking an electronic component by a picking tool in a component mounting machine according to claim 1,
  b) measuring at least one electrical property of the electronic component picked and held by the picking tool using the verification unit of the component mounting machine.

12. A board for testing electrical properties of an electronic component; said board comprising
  plurality of test electrodes arranged on a first surface of said board, wherein at least one test electrode is arranged on a flexible portion of the board that is configured to flex upon engagement with an electronic component to be tested.

13. A method for manufacturing a board according to claim 12, in which at least one flexible portion is defined by slits in the board and at least one hinge portion of the board; comprising the step of
  a1) forming slits in in said board around at least one side of a test electrode, thereby forming said flexible portion and at least one hinge portion.

14. A method according to claim 13, further comprising a step of forming a section of a hinge portion that is thinner than the flexible portion wherein the surface onto which the test electrodes are arranged is a front surface of said board and said section that is thinner than the flexible portion is formed as a cut-out on the reverse surface of the board.

15. A method according to claim 13, wherein step a1) is performed by laser cutting or cutting with a water jet.

* * * * *